United States Patent [19]

Tashiro

[11] Patent Number: 5,124,781
[45] Date of Patent: Jun. 23, 1992

[54] SEMICONDUCTOR DEVICE HAVING ORGANIC FILM AS INTERLAYER INSULATING FILM FOR MULTILAYER WIRINGS

[75] Inventor: Tsutomu Tashiro, Tokyo, Japan

[73] Assignee: NEC Corporation, Japan

[21] Appl. No.: 492,415

[22] Filed: Mar. 6, 1990

Related U.S. Application Data

[63] Continuation of Ser. No. 346,808, May 3, 1989, abandoned.

[30] Foreign Application Priority Data

May 6, 1988 [JP] Japan .................. 63-110993

[51] Int. Cl.⁵ .................. H01L 23/48; H01L 29/44; H01L 29/52; H01L 29/60
[52] U.S. Cl. .................. 357/68; 357/30; 357/71
[58] Field of Search .................. 357/71, 49, 68, 30Q; 437/187, 195

[56] References Cited

U.S. PATENT DOCUMENTS

| | | | |
|---|---|---|---|
| 4,349,609 | 9/1982 | Takeda et al. | 428/429 |
| 4,451,326 | 5/1984 | Gwozdz | 156/643 |
| 4,523,372 | 6/1985 | Balda et al. | 29/590 |
| 4,601,939 | 7/1986 | Gati et al. | 428/161 |
| 4,613,888 | 9/1986 | Mase et al. | 357/54 |
| 4,646,126 | 2/1987 | Iizuka | 357/51 |
| 4,821,092 | 4/1989 | Nogachi | 357/4 |

FOREIGN PATENT DOCUMENTS

| | | | |
|---|---|---|---|
| 57-59339 | of 1982 | Japan . | |
| 58-125847 | 7/1983 | Japan | 357/68 |
| 60-227469 | 11/1985 | Japan | 357/21 |
| 62-298137 | of 1987 | Japan . | |

OTHER PUBLICATIONS

Harding et al., 'Universal Monolithic Circuit...', IBM Tech Discl., vol. 8 #5, Oct. 1965 pp. 804-805.
Cortellino et al., 'Dielectric Sputtering for Multilayer Circuitry', IBM Tech Discl., vol 14 #2, Jul. 71, p. 429.
David et al., 'Producing Integral via and Pad Metallurgy', IBM Tech. Discl., vol. 14 #1, Jun. 71, p. 101.

Primary Examiner—Jerome Jackson, Jr.
Assistant Examiner—Stephen D. Meier
Attorney, Agent, or Firm—Ostrolenk, Faber, Gerb & Soffen

[57] ABSTRACT

A semiconductor device which includes a semiconductor substrate, an element region formed on one of the principal surfaces of the semiconductor substrate with multilayer wiring structure having an organic film as an interlayer insulating film, a plurality of electrically conductive pillars formed in the periphery of the element region on the principal surface of the substrate, an organic interlayer insulating film formed between the plurality of electrically conductive pillars, and bonding pads formed on the plurality of electrically conductive pillars and extending from the upper layer wiring of the element region.

9 Claims, 4 Drawing Sheets

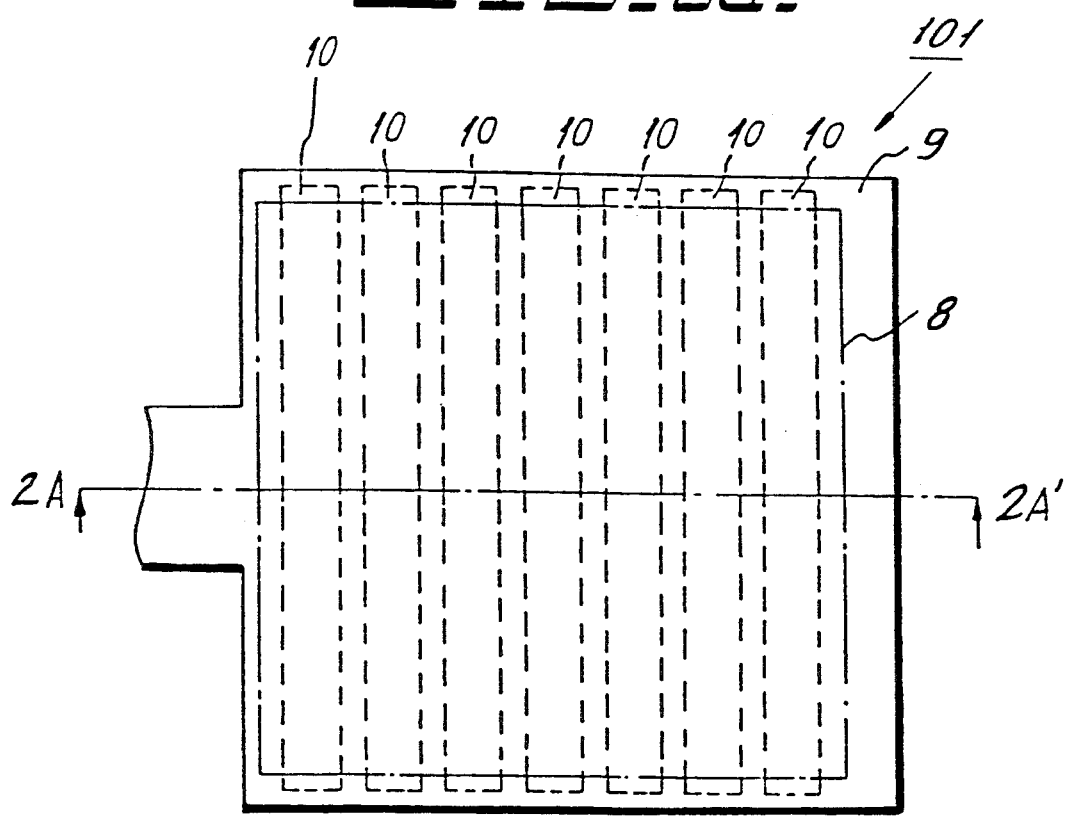
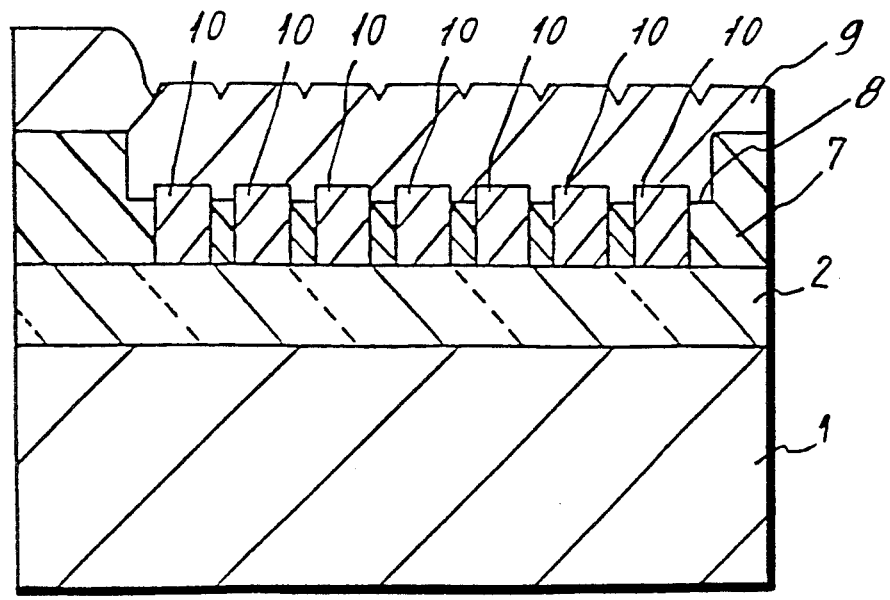

SEMICONDUCTOR DEVICE HAVING ORGANIC FILM AS INTERLAYER INSULATING FILM FOR MULTILAYER WIRINGS

This is a continuation of application Ser. No. 07/346,808 filed on May 3, 1989 now abandoned.

BACKGROUND OF THE INVENTION

1. Field of the Invention

The present invention relates to a semiconductor device, and more particularly to a semiconductor device which makes use of an organic film as an interlayer insulating film for multilayer wirings.

2. Description of the Related Art

When an organic film is used as an interlayer insulating film for a multilayer wiring, the organic film is arranged beneath the bonding pads, so that there has been a problem that cracks are generated in the organic interlayer film at the time of wirebonding, and the bonding pad tends to come off the substrate together with the organic interlayer film. In order to solve these problems, there is disclosed in Japanese Patent Laid Open No. 57-59339 and Japanese Patent Laid Open No. 62-298137 a technique in which the organic interlayer film is removed partially to provide an aperture which exposes an oxide film on a semiconductor substrate, and form a bonding pad directly above the oxide film within the aperture by extending an upper wiring layer into the aperture.

However, the thickness of the organic interlayer insulating film is about 1.0–2.0 $\mu$m per layer, so that the step of the aperture becomes high and the wiring connected to the bonding pad tends to be broken at the edge of the step. This tendency becomes more conspicuous as the number of layers of the multilayer wiring is increased. In order to prevent the breaking of the wiring at the step edge, one might consider to give a slope to the sidewalls of the aperture. However, it leads to an increase in the occupying area of the bonding pad which in turn brings about an increase in the chip size.

In order to prevent the breaking of the wiring at the step edge without creating an increase in the occupying area of the bonding pad, it may be thought of providing a layer which will not give rise to cracks or peeling at the time of bonding, for example, a metallic layer with the same material quality as that of the wiring or bonding pad, between the bonding pad and the oxide film on the semiconductor substrate. The applicant of the present invention formed a pattern with line width of 10 $\mu$m and line interval of 2 $\mu$m in the element region, and a pattern with 100 $\mu$m square at the bonding pad region by the use of an aluminum wiring layer with thickness of 1.0 $\mu$m, and then formed a polyimide film to have a thickness of 1 $\mu$m in the element region. As a result, a polyimide film having a thickness of 2 $\mu$m was obtained on the aluminum pattern of the bonding pad region. This is considered due to heaping of the polyimide at the central parts of the squares which is caused by surface tension when their area is large.

As in the above, in the case of organic interlayer films, thicknesses of films formed differ greatly for the wiring part where step parts exist densely and for the chip periphery where bonding pads are formed, their ratio approaching even about 1 to 2, and creating a new problem based on this circumstance. Namely, there is a substantial difference in the thicknesses of the organic interlayer insulating films for the element region where through-holes are to be opened narrowly and densely and for the bonding pad region where the aperture for the bonding pads is to be opened. Consequently, if the aperture is opened so as to be appropriate for the bonding pad having a large thickness, the through-holes in the element region become too large due to overetching. Therefore, simultaneous formation, in a single lithographic process, of the openings for the bonding pads and the through-holes connecting the wirings with each other, becomes extremely difficult.

SUMMARY OF THE INVENTION

It is, therefore, an object of the present invention to provide a semiconductor device having an organic film as an interlayer insulating film for multilayer wiring, and a bonding pad structure which gives rise neither to breaking of wirings at the step edge nor to an increase in the occupying area, and still does not require an increase in the number of manufacturing steps.

The semiconductor device in accordance with the present invention includes a semiconductor substrate, an element region provided on one principal surface of the semiconductor substrate, a first wiring layer formed on the element region, an organic interlayer insulating film formed on the first wiring layer and between the gaps in the first wiring layer, a second wiring layer formed on the organic interlayer insulating film, a plurality of electrically conductive pillars having predetermined width and length disposed separated with a predetermined interval one from another in the region outside of the element region on the surface of the semiconductor substrate, an organic interlayer insulating film formed between the plurality of electrically conductive pillars, and a bonding pad extending from the second wiring layer and formed on the plurality of electrically conductive pillars.

A plurality of electrically conductive pillars and an organic interlayer insulating film filled in the gaps between the pillars are provided beneath the bonding pad, so that the steps between the second wiring layer and the bonding pad does not amount too much and hence no breaking of wirings at the step edges will take place. Further, the electrically conductive layer provided beneath the bonding pad are divided into a plurality of electrically conductive pillars so that their line width and the line interval become close to those of the wiring pattern of the first wiring layer within the element region. Therefore, the thickness of the organic interlayer insulating film formed on the electrically conductive pillars becomes substantially equal to that of the organic interlayer insulating film formed on the first wiring layer in the element region. As a result, the fine through-holes exposing the first wiring layer in the element region and the aperture for the bonding pad exposing the plurality of electrically conductive pillars become obtainable in one photolithographic process. Further, the bonding pads are formed on plurality of electrically conductive pillars so that there will arise no cracks or peeling of the interlayer insulating film even when there exists the interlayer insulating layer between the electrically conductive pillars.

The first wiring layer and the plurality of electrically conductive pillars which are ordinarily made of aluminum can be formed in one single process. The plurality of electrically conductive pillars are normally formed on a silicon oxide film provided on the principal surface of the semiconductor substrate. In addition, it is desirable to provide a silicon nitride film or a silicon oxynitride film between the silicon oxide film and the plurality of electrically conductive pillars in order to improve the adhesion between aluminum and the silicon oxide films and to enhance the resistance to cracking at the time of wire-bonding.

On the surface of the first wiring layer, a silicon nitride film or a silicon oxynitride film may be formed in order to increase the moisture resistance. In that case, when the plurality of electrically conductive pillars and the first wiring layer are formed in one process, the silicon nitride or silicon oxynitride films will also be formed on the surface of the plurality of the electrically conductive pillars. Presence of the silicon nitride film or the silicon oxynitride film between the upper surface of the plurality of electrically conductive pillars and the bonding pad is of no particular problem. However, by providing an organic interlayer insulating film on the first wiring layer and the plurality of electrically conductive pillars and by forming the fine through-holes that exposes the first wiring layer and the aperture for the bonding pad simultaneously in one photolithographic process, the silicon nitride film or silicon oxynitride film on the upper surface of the plurality of electrically conductive pillars will also be removed. As a result, the bonding pad will be provided in direct contact with the plurality of electrically conductive pillars.

The width of each of the electrically conductive pillars is preferably in the range of 3 to 10 $\mu$m. If it is not smaller than 10 $\mu$m, the thickness of the organic interlayer insulating film on the electrically conductive pillars becomes too large compared with the thickness of the organic interlayer insulating film on the first wiring layer in the element region owing to the surface tension, so that it becomes impossible to form the through-holes for the element region simultaneously with the aperture for the bonding pad. On the other hand, if it is not greater than 3 $\mu$m, adhesion between each of the electrically conductive pillars and the substrate is reduced and the conductive pillars tend to be peeled off at the time of bonding. Further, the ratio L/S of the width (L) of the conductive pillars to the interval (S) between the conductive pillars is preferable to be in the range of 2 to 20. If the ratio is not greater than 2, the area occupied by the conductive pillars is reduced and peeling tends to occur at the time of bonding. In addition, the working accuracy of the electrically conductive layer is about 0.5 $\mu$m so that the L/S value has to be not greater than 20 in order to keep the width of the conductive pillar to be smaller than 10 $\mu$m.

The plurality of the conductive pillars need not be connected electrically to the element region, and a power or a signal may be supplied to the element region through the second wiring layer that extends from the bonding pad. To realize a multilayer wiring of 3 or more layers, a plurality of electrically conductive layers consisting of a plurality of conductive pillars are provided between above-mentioned plurality of conductive pillars and the bonding pad. In this case, it is preferable to provide a second wiring layer as the uppermost layer extending to the bonding pad. This is because it becomes possible to increase the current capacity. Therefore, in order to use the bonding pad as a bonding pad for power supply, it is preferable to extend the wiring layer of the same layer as the bonding pad layer from the bonding pad to the element region.

It should be noted that in Japanese Patent Laid Open No. 62-45151, there is disclosed a semiconductor device with multilayer wiring structure in which there are provided bonding pad extended from a second layer of aluminum wiring layer and formed on a first layer of aluminum film which is not connected to the element region and is formed on an $SiO_2$ film on a semiconductor substrate. However, this is a technique for applying the two-layer structure of a silicon oxide film and a polyimide film to the interlayer insulating film. In order to solve the problem that the silicon oxide film tends to develop cracks at the time of wire-bonding which leads to breakage of the lower layer wirings, this technique proposes to extend the second layer of wiring provided on the first layer of wiring from the bonding pad to the element region without extending the first layer of wiring from the bonding pad to the element region. In contrast to this, the present invention uses for the interlayer insulating film an organic film or a two-layer film consisting of an organic film and a silicon nitride film or a silicon oxynitride film. Such a film will not give rise to breaking of the wiring underneath due to cracks produced in the film at the time of bonding. Accordingly, the application field of this publication is different from that of the present invention.

Further, in Japanese Patent Laid Open No. 60-20523 there is disclosed a structure in which a plurality of narrow electrically conductive layers are provided with predetermined intervals outside the bonding pad in order to solve the problem that through-holes and an aperture for the bonding pad cannot be formed simultaneously because of the fact that on the bonding pad part with wide area there is formed a thicker interlayer insulating film compared with that on the region with narrow width of wiring. However, in this publication cited, apertures are formed on the plurality of narrow conductive layers outside the bonding pad, so that the current capacity cannot be increased and hence the proposed structure cannot be applied to the bonding pad for power supply.

BRIEF DESCRIPTION OF THE DRAWINGS

The above and further objects, features and advantages of the present invention will become more apparent from the following detailed description taken in conjunction with the accompanying drawings, wherein:

FIG. 2(a) is a plan view in which the bonding pad 101 for power supply in FIG. 1 is partially enlarged;

FIG. 2(b) is a sectional view taken along the line A—A' in FIG. 2;

DESCRIPTION OF THE PREFERRED EMBODIMENTS (First Embodiment)

Figure 1:
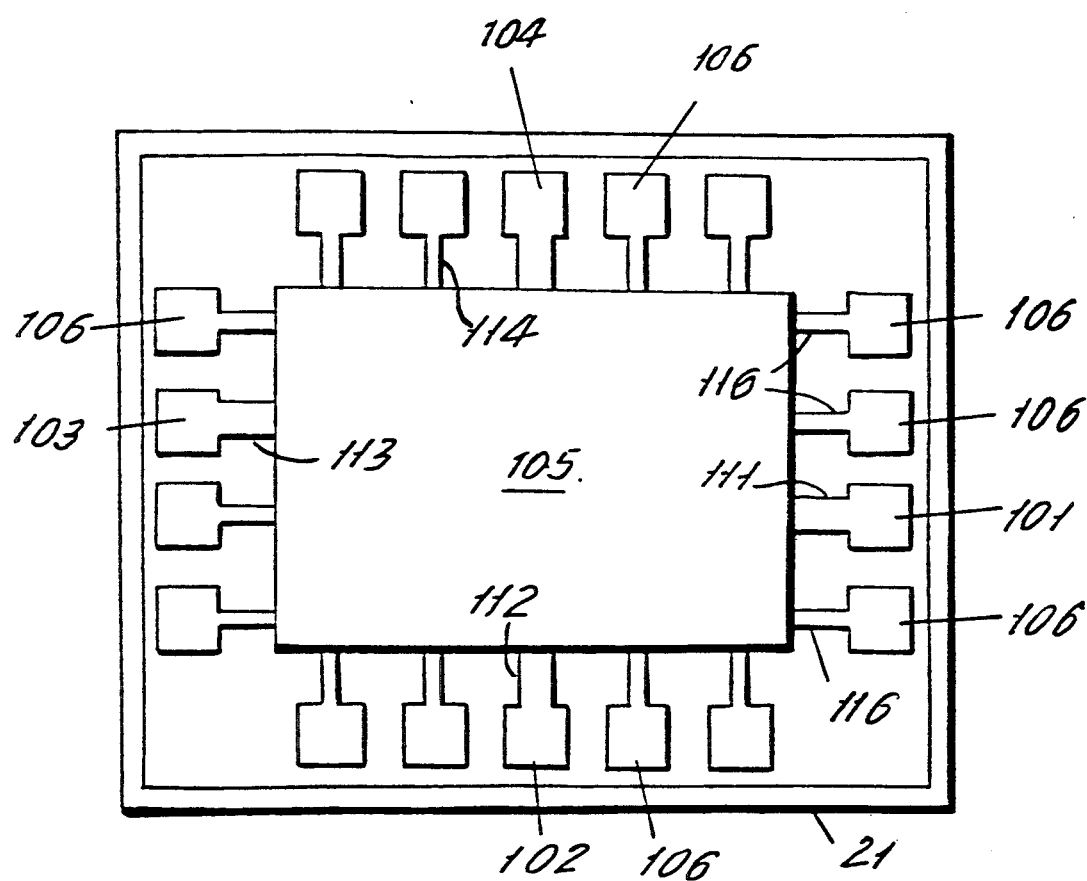
FIG. 1 is a plan view of a first embodiment of the semiconductor device of the present invention.

Referring to FIG. 1, an element region 105 having two-layer wiring is formed at the central part of a semiconductor chip 21, and there are formed bonding pads 101-104 for power supply and bonding pads 106 for signals in the periphery of the element region 105. The wirings 111-114 from the power supply bonding pads 101-104 to the element region 105 are formed wide while the wirings 116 from the signal bonding pads 106 are formed narrow. The signal bonding pads 106 and their wirings 116 are formed by using a first aluminum layer, and the bonding pads for power supply 101-104 and their wirings 111-114 are formed by using a second aluminum layer.

Referring to FIGS. 2(a) and 2(b), a bonding pad part 101 includes a silicon substrate 1, a field insulating film 2, a plurality of striplike extending patterns 10 of a first layer of aluminum wiring that extend over the field insulating film 2, a polyimide resin film 7 formed to bury the striplike extending patterns 10 of the first layer of aluminum wiring, an aperture 8 in the polyimide resin film 7 opened to the depth so as to expose the surface of the striplike extending patterns 10 of the first layer of aluminum wiring, and a square extending pattern 9 of a second layer of aluminum wiring in contact with the striplike extending patterns 10 of the first layer of aluminum wiring. Here, the dimension and the number of the striplike extending patterns 10 of the first layer of aluminum wiring are selected appropriately in accordance with the wiring density of the first layer of aluminum wiring in the element region 105, and may be chosen, for example, to be 9 $\mu$m pitch (line width of 7 $\mu$m and line spacing of 2 $\mu$m) and 8 to 12 lines. When the first layer of aluminum are formed in fine striplike forms as in the above, the thickness of the polyimide film 7 is nearly uniform over the wirings within the element region 105 and over the striplike extending patterns 10. Therefore, the opening conditions for the through holes above the wirings in the element region 105 and the opening conditions for the bonding pad aperture 8 can be made equal, so that it becomes possible to form the through holes in the element region 105 and the aperture 8 for bonding pad 101 simultaneously in a single etching process. Further, since the polyimide resin film 7 does not exist directly below the square extending pattern 9 of the second layer of aluminum wiring, there will not occur such inconveniences as developing cracks in, or creating peeling of, the resin film 7 during the bonding process.

(Second Embodiment)

Figure 3:
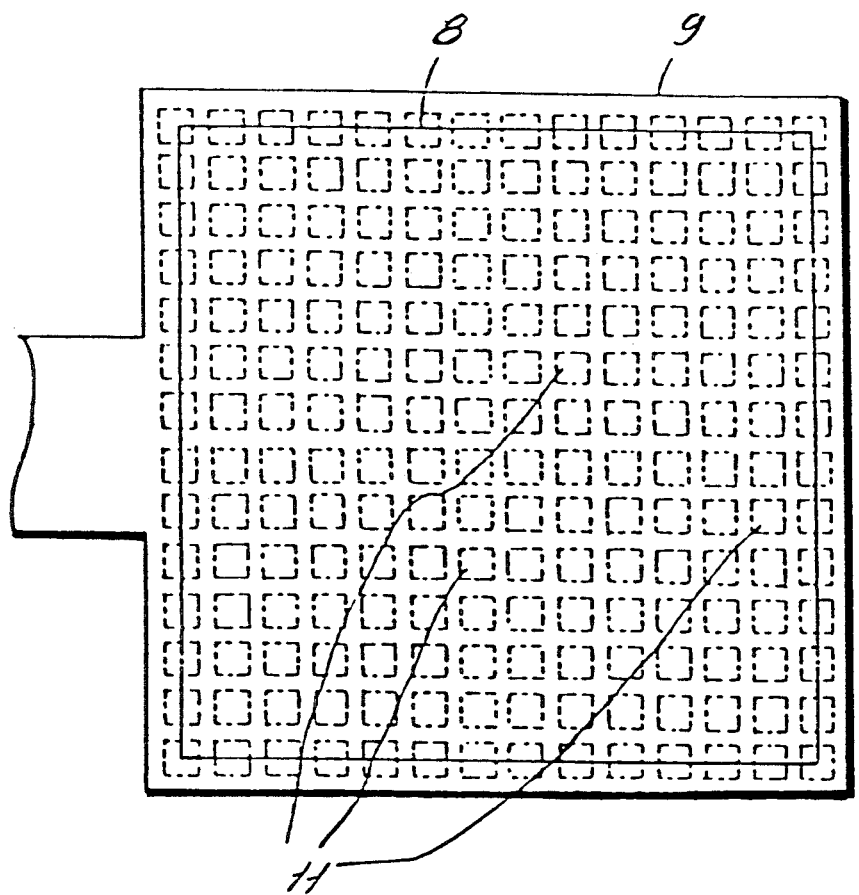
FIG. 3 is a plan view of a bonding pad for power supply of a second embodiment of the semiconductor device of the present invention.

FIG. 3 is a plan view of the bonding pad part for power supply showing a second embodiment of the present invention when it is applied to a semiconductor integrated circuit device of two-layer wiring. The arrangement of the element region 105 and the bonding pads 101-104 and 106 is the same as that of the first embodiment, and only the construction of the bonding pads for power supply 101-104 is made different. In accordance with the present embodiment, the first layer of aluminum are formed as finer square patterns 11 consisting of 196 blocks of 8 $\mu$m pitch (6 $\mu$m square with 2 $\mu$m interval), instead of the striplike patterns 10 of the first embodiment. With the present embodiment, a still greater effect can be obtained since the opening conditions for the aperture 8 for the bonding pad can be brought closer to those of the through holes over the first wiring patterns in the element region 105.

Although the above description has been given specifically in conjunction with a two-layer wiring, an similar technique is also applicable to the cases of three or more layers. The lower conductive layers under the bonding pads are formed within the apertures for the bonding pad into fine patterns of strips or blocks depending on the respective wiring densities. In order to illustrate this, an embodiment of a four-layer wiring will be described in the following.

(Third Embodiment)

This embodiment relates to a semiconductor device having a four-layer wiring construction. The arrangement of the element region 105 and the bonding pads 101-104 and 106 is the same as the case of the first embodiment.

Figure 4A:
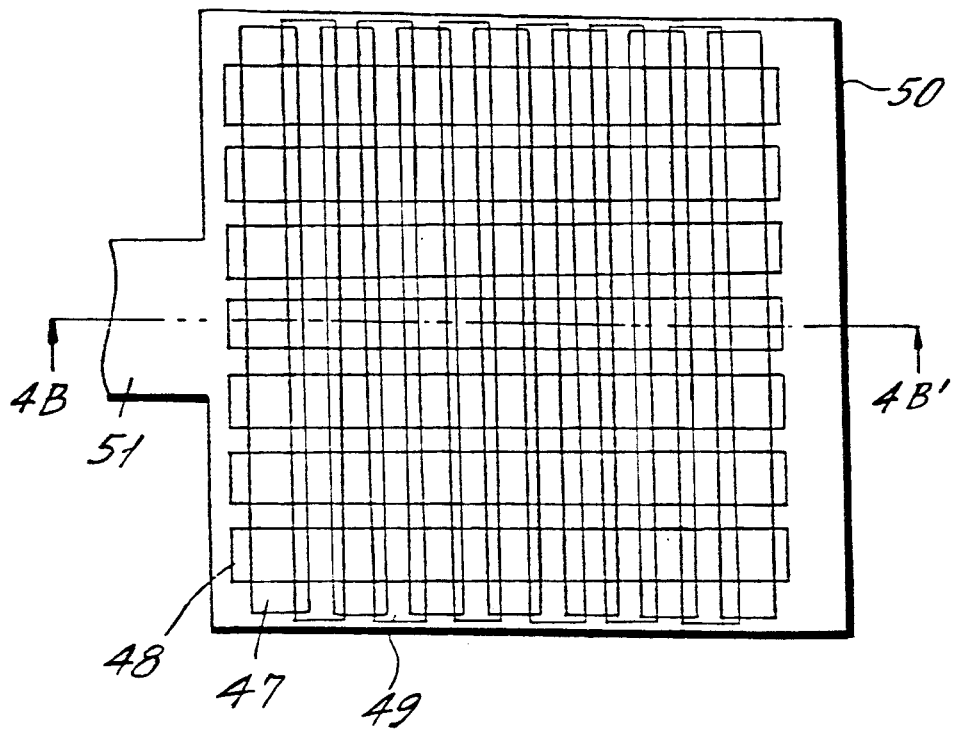
FIG. 4(a) is a plan view of the bonding pad for power supply of a third embodiment of the semiconductor device of the present invention.
Figure 4B:
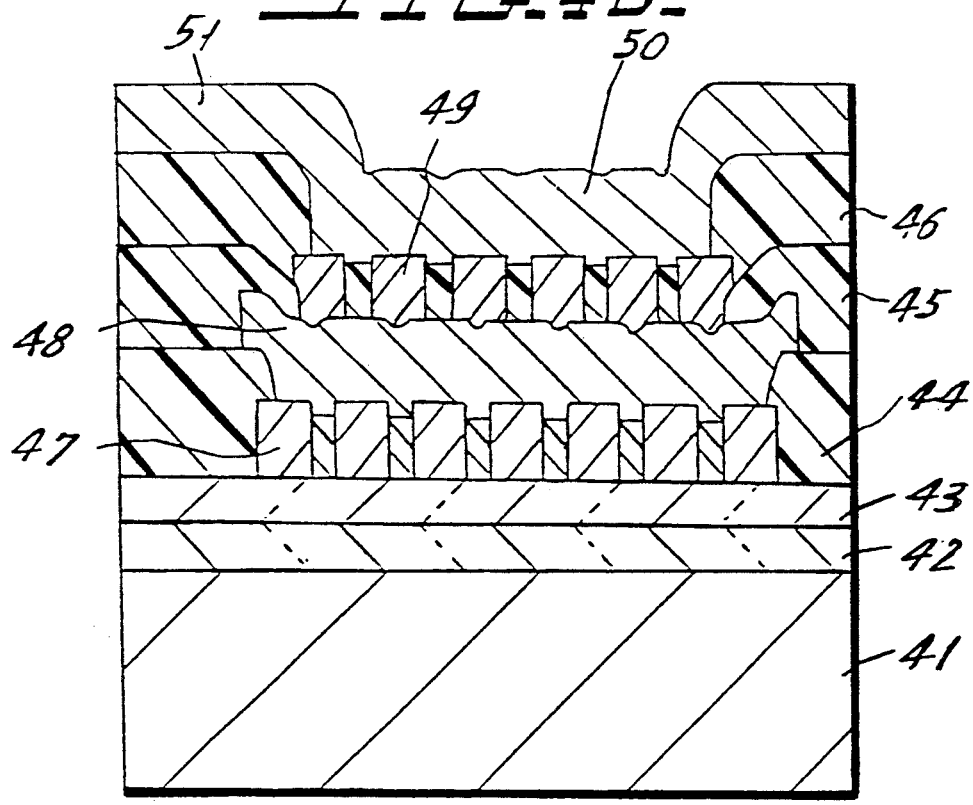
FIG. 4(b) is a sectional view taken along the line B—B' in FIG. 4(a)

Referring to FIGS. 4(a) and 4(b), an $SiO_2$ film 42 is deposited on a silicon substrate 41 to a thickness of 1 $\mu$m and an $SiO_{0.5}N_{0.5}$ film 43 with thickness 4000 Å is formed on the $SiO_2$ film 42. The SiON film 43 is provided to enhance the adhesion of $SiO_2$ 42 with the aluminum layer and to prevent the formation of cracks in $SiO_2$ 42. On the $SiO_{0.5}N_{0.5}$ film 43, there are laminated a first, second and third striplike aluminum patterns 47, 48 and 49 in this order. In order to prevent the breaking of a fourth aluminum layer by the step edges, the first layer aluminum patterns 47 and the second layer aluminum patterns 48 are criss-crossed with each other, and the third layer aluminum patterns 49 are disposed in parallel with the first layer aluminum patterns 47 but not to overlap each other. The first, second and third layer aluminum patterns 47, 48 and 49 are formed respectively with a pitch of 10 $\mu$m wherein the line width is 8 $\mu$m and the interval between the lines is 2 $\mu$m. The thickness of the first, second and third layers of aluminum patterns 47, 48 and 49 is 1 $\mu$m. Between aluminum patterns 47, 48 and 49 of the first, second and third layers there are formed first, second and third layers 44, 45 and 46, respectively, of polyimide film. The thickness of each of the polyimide films 44, 45 and 46 in the regions where no aluminum patterns are formed is 2 $\mu$m.

On the third layer of polyimide film 46 there is provided a fourth aluminum layer with thickness 1 $\mu$m, and a fourth aluminum pattern for bonding 50 that cover the first, second and third aluminum patterns 47, 48 and 49, and an aluminum wiring 51 that extends from the aluminum patterns 50 to the element region 105 are formed.

(Fourth Embodiment)

Figure 5:
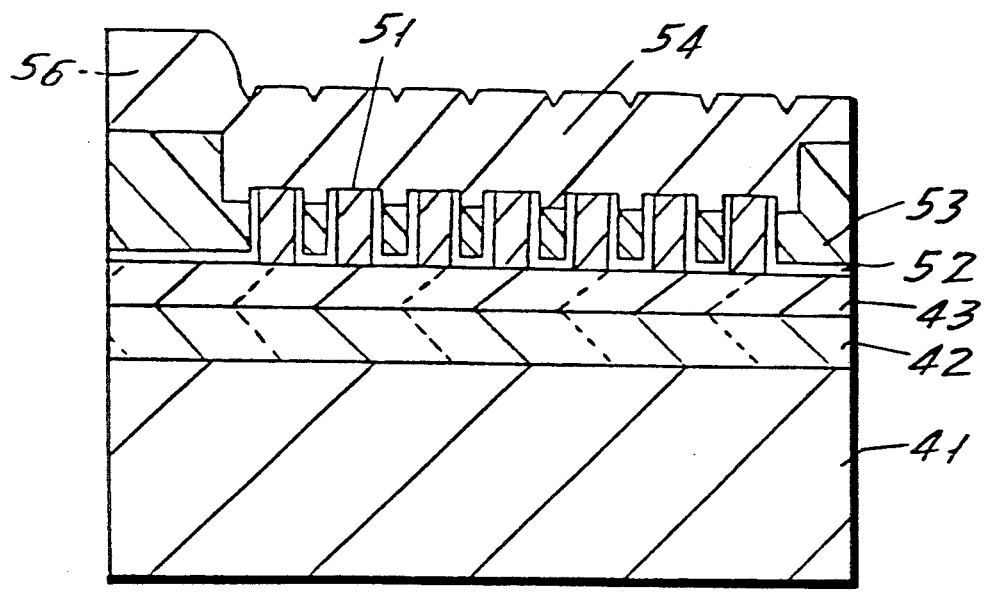
FIG. 5 is a sectional view of the bonding pad for power supply of a fourth embodiment of the semiconductor device of the present invention.

In this embodiment, the element region 105 and the bonding pads 101-104 and 106 are disposed again in the same manner as in the first embodiment shown in FIG. 1. Referring to FIG. 5, an $SiO_2$ film 42 of thickness 1 $\mu$m is deposited on a silicon substrate 41, and an $SiO_{0.5}N_{0.5}$ film of thickness 4000 Å is formed on the $SiO_2$ film 42. Striplike first layer aluminum patterns 51 with thickness of 1 $\mu$m are formed on top of the $SiO_{0.5}N_{0.5}$ film 43. The line width and the line interval of the aluminum patterns 51 are 8 $\mu$m and 2 $\mu$m, respectively. On top of the aluminum patterns 51 there is formed an $SiO_{0.5}N_{0.5}$ film 52 of thickness 1000 Å by plasma CVD method to enhance the moisture resistance, and on top of the $SiO_{0.5}N_{0.5}$ film 52 there is formed a polyimide film 53. An aperture which exposes the aluminum patterns 51 are formed simultaneously with the through-holes in the element region, so that the $SiO_{0.5}N_{0.5}$ film 52 on the aluminum patterns 51 is already removed. A second layer of Au is provided on top of the polyimide film 53 to form a gold pattern 54 for bonding which cover the aluminum patterns 51 and a wiring 56 which extends from the gold pattern 54 to the element region 105.

What is claimed is:

1. A semiconductor device, comprising:
 a semiconductor substrate which includes (a) an element region in which a plurality of semiconductor elements are formed and (b) a separate surface portion which is separate from said element region;
 a first wiring layer formed on said element region, said first wiring layer having gaps therein;
 a first organic interlayer insulating film formed on said first wiring layer and filling said gaps;
 a second wiring layer formed on said first organic interlayer insulating film;
 a plurality of openings formed in said first organic interlayer insulating film for electrically connecting predetermined portions of said first wiring layer to predetermined portions of said second wiring layer;
 a plurality of spaced apart electrically conductive pillars, said electrically conductive pillars being formed on said separate surface portion of said semiconductor substrate, each of said electrically conductive pillars being in the form of a rectangle or a square, the length of the short side of said rectangle or the length of the sides of said square being in the range of 3 to 10 um, wherein said electrically conductive pillars are not connected to said first wiring layer;
 a second organic interlayer insulating film formed between said electrically conductive pillars; and
 a conductive layer for electrically connecting said second wiring layer to an external circuit, said conductive layer being formed on and in contact with said electrically conductive pillars to form an electrical connection therebetween.

2. A semiconductor device as claimed in claim 1, further comprising a silicon nitride film or a silicon oxynitride film provided on said first wiring layer and on said pillars.

3. A semiconductor device as claimed in claim 1, further comprising a second set of spaced apart electrically conductive pillars and a third organic interlayer insulating film provided between said first set of pillars and said conductive layer.

4. A semiconductor device as claimed in claim 1, further comprising a silicon oxide film formed between said semiconductor substrate and said pillars.

5. A semiconductor device as claimed in claim 4, further comprising a silicon nitride film or a silicon oxynitride film formed between said silicon oxide film and said pillars.

6. A semiconductor device as claimed in claim 1, wherein said first wiring layer and said pillars are made of aluminum.

7. A semiconductor device as claimed in claim 1, wherein the ratio of the length of the short side of said rectangle or the length of the sides of said square to the intervals between said spaced apart pillars is in the range of 2 to 20.

8. A semiconductor device, comprising:
 a semiconductor substrate;
 a field insulating layer formed on said semiconductor substrate; and
 a bonding pad selectively formed on said field insulating layer, said bonding pad comprising a plurality of conductive blocks formed on said field insulating layer, said conductive blocks being arrange din a matrix of a plurality of rows and columns to form predetermined gaps between the respective conductive blocks, an insulating film formed on said field insulating layer to fill said predetermined gaps such as to leave an upper surface of each of said conductive blocks exposed, and a conductive layer formed on said conductive blocks and said insulating film in contact with the exposed upper surface of each of said conductive blocks and a surface of said insulating film.

9. A semiconductor device as claimed in claim 8, wherein said insulating film is an organic insulating film.

* * * * *